(12) United States Patent
Liu (10) Patent No.: US 9,264,025 B2
(45) Date of Patent: Feb. 16, 2016

(54) GLITCH FILTER AND FILTERING METHOD

(71) Applicant: NANYA TECHNOLOGY CORPORATION, Tao-Yuan Hsien (TW)

(72) Inventor: Bin Liu, Boise, ID (US)

(73) Assignee: NANYA TECHNOLOGY CORPORATION, Taoyuan (TW)

( * ) Notice: Subject to any disclaimer, the term of this patent is extended or adjusted under 35 U.S.C. 154(b) by 0 days.

(21) Appl. No.: 13/966,298

(22) Filed: Aug. 14, 2013

(65) Prior Publication Data

US 2015/0048880 A1 Feb. 19, 2015

(51) Int. Cl.
*H03K 5/00* (2006.01)
*H03K 5/1252* (2006.01)

(52) U.S. Cl.
CPC .................................. *H03K 5/1252* (2013.01)

(58) Field of Classification Search
CPC .................................................... H03K 5/1252
USPC ..................... 327/551–559, 34, 36
See application file for complete search history.

(56) References Cited

U.S. PATENT DOCUMENTS

| | | | | |
|---|---|---|---|---|
| 5,019,724 A * | 5/1991 | McClure | ........................ | 326/29 |
| 5,198,710 A * | 3/1993 | Houston | ...................... | 327/552 |
| 6,222,403 B1 * | 4/2001 | Mitsuda | ....................... | 327/170 |
| 6,356,101 B1 * | 3/2002 | Erstad | ............................. | 326/27 |
| 7,577,053 B2 * | 8/2009 | Freebern | ....................... | 365/227 |
| 7,928,772 B1 * | 4/2011 | Fong | ................ | 327/34 |
| 8,553,472 B2 * | 10/2013 | McCombs et al. | ....... | 365/189.05 |

* cited by examiner

*Primary Examiner* — Dinh Le
(74) *Attorney, Agent, or Firm* — CKC & Partners Co., Ltd.

(57) ABSTRACT

A glitch filter is disclosed herein. The glitch filter includes a high glitch filter circuit, a low glitch filter and a control circuit. The high glitch filter circuit is configured for generating a pull-up control signal in accordance with the input signal. The low glitch filter circuit is configured for generating a pull-down control signal in accordance with the input signal. The control circuit is configured for determining the logic level of the output of the glitch filter in accordance with the pull-up control signal and the pull-down control signal. A filtering method for filtering glitches is disclosed herein as well.

9 Claims, 8 Drawing Sheets

GLITCH FILTER AND FILTERING METHOD

BACKGROUND

1. Field of Invention

The present invention relates to the integrated circuits. More particularly, the present invention relates to a glitch filter.

2. Description of Related Art

Electronic circuits are subject to signal distortion and noise in operation. The signal distortion and the noise may significantly reduce the performance of the electronic circuits. In certain cases, the signal distortion and the noise may even cause the operation of the electronic circuits failed. For example, there exists a noise "glitch", which is often considered as an aperiodic noise in the operation of the electronic circuits.

Figure 1A:
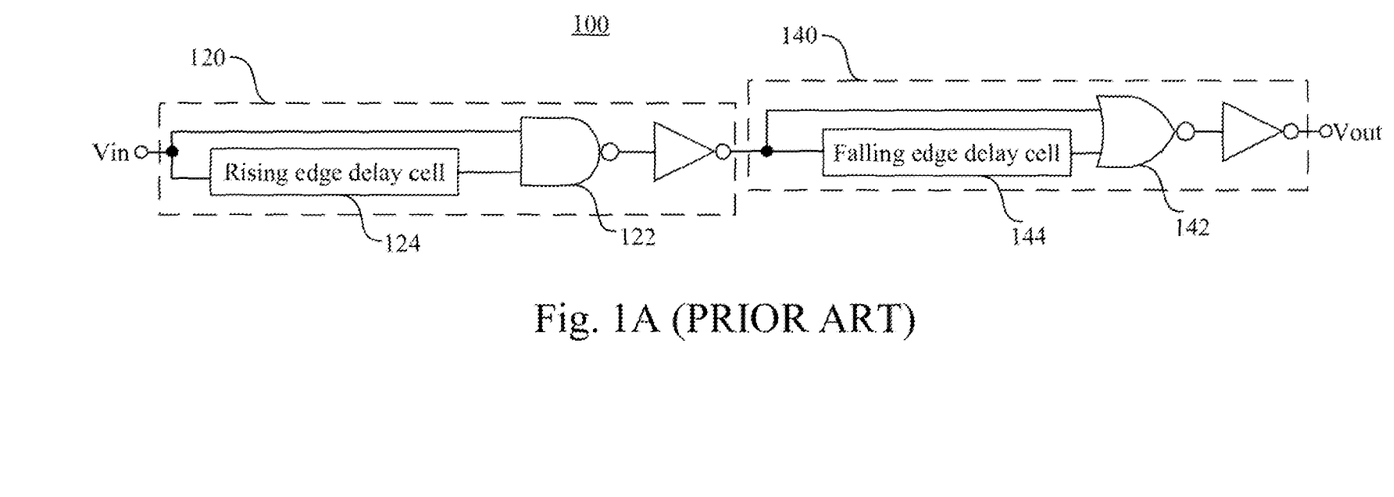
FIG. 1A is a circuit diagram of the glitch filter according to the prior art.

FIG. 1A is a circuit diagram of a glitch filter 100 according to the prior art. As shown in FIG. 1A, the glitch filter 100 includes a high glitch filter 120 and a low glitch filter 140, and the high glitch filter 120 is connected to the low glitch filter 140 in series. At first, an input signal Vin is sent to one of the inputs of the NAND gate 122 directly and to another one of the inputs of the NAND gate 122 through a rising edge delay cell 124 which provides a delay time tdr on the rising edge of the input signal Vin, and the high glitch with pulse width less than the delay time tdr will be filtered. Second, the output of the high glitch filter is connected to the one of the inputs of the NOR gate 142 and to the another one of the inputs of the NOR gate 142 through a falling edge delay cell 144 which provides a delay time tdf on the falling edge of the input signal Vin. Thus, the low glitch with pulse width less than the delay time tdf will be filtered.

Figure 1B:
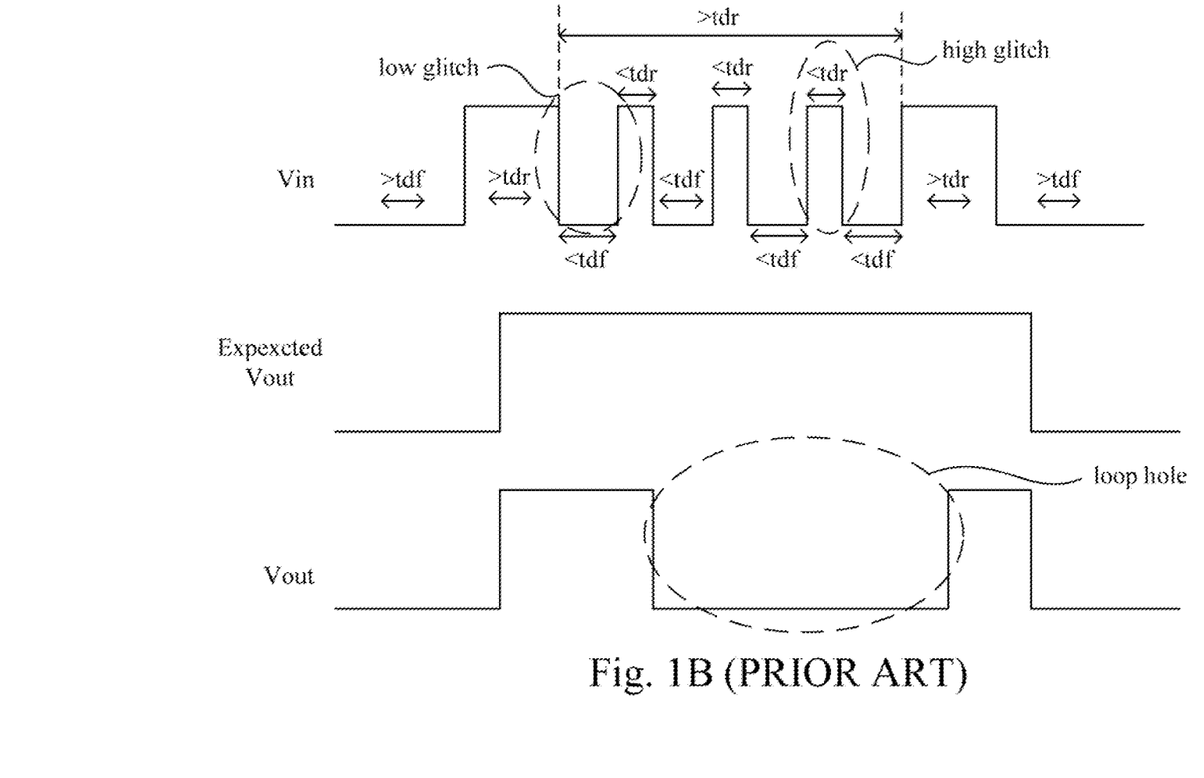
FIG. 1B is a wave diagram of the glitch filter 100 according to the prior art.

FIG. 1B is a wave diagram of the glitch filter 100 according to the prior art. As shown in FIG. 1B, if the input signal Vin oscillates during its enabling period (i.e., the time being logic "1"), the glitch filter 100 is expected to output a smooth signal with high logic level. However, in practical application, the glitch filter 100 filters the first high glitch and makes the low glitch wider than working range of the glitch filter 100, and the glitch filter toggles its output to low logic level for a while. In this case, the aforementioned low logic level is considered as a loophole, which refers to that the glitch filter 100 cannot correctly filter the input signal Vin. Further, as shown in the FIG. 1A, the glitch filter 100 may add more delay to the edges of the input signal Vin, which has some impact to the certain propagation delay sensitive circuit.

Therefore, a heretofore unaddressed need exists in the art to address the aforementioned deficiencies and inadequacies.

SUMMARY

An aspect of the present invention is to provide a glitch filter. The glitch filter includes a high glitch filter circuit, a low glitch filter and a control circuit. The high glitch filter circuit is configured for generating a pull-up control signal in accordance with the input signal. The low glitch filter circuit is configured for generating a pull-down control signal in accordance with the input signal. The control circuit is configured for determining the logic level of the output of the glitch filter in accordance with the pull-up control signal and the pull-down control signal.

According to one embodiment of the present invention, the high glitch filter circuit includes a rising time delay unit and a NAND gate circuit. The rising time delay unit is configured for delaying the rising edge of the input signal for a first delay time. The NAND gate circuit is configured for generating the pull-up control signal in accordance with the input signal and the input signal delayed by the rising time delay unit.

According to one embodiment of the present invention, the low glitch filter circuit includes a falling time delay unit and a NOR gate circuit. The falling time delay unit is configured for delaying the falling edge of the input signal for a second delay time. The NOR gate circuit is configured for generating the pull-down control signal in accordance with the input signal and the input signal delayed by the falling time delay unit.

According to one embodiment of the present invention, the control circuit includes a pull-up unit and a pull-down unit. The pull-up unit is configured for pulling up the output of the glitch filter to a high logic level in accordance with the pull-up control signal. The pull-down unit is configured for pulling down the output of the glitch filter to a low logic level in accordance with the pull-down control signal.

According to one embodiment of the present invention, the glitch filter further includes a latch. The latch is electrically coupled to the output of the glitch filter in parallel, and the latch is configured for keeping the previous logic level of the output of the glitch filter.

According to one embodiment of the present invention, the latch includes a first inverter, a second inverter, a first enable unit, and a second enable unit. The first inverter is configured for inverting the output of the glitch filter. The input of the second inverter is electrically coupled to an output of the first inverter, and an output of the second inverter is electrically coupled to the output of the glitch filter. The first enable unit is configured for turning on the pull-up path of the second inverter in accordance with the pull-down control signal. The second enable unit is configured for turning on the pull-down path of the second inverter to the low logic level in accordance with the pull-up control signal.

According to one embodiment of the present invention, the glitch filter further includes a buffer. The buffer is configured for increasing an output driving ability of the glitch filter, wherein an input of the buffer is electrically coupled to the output of the first inverter.

Another aspect of the present invention is to provide a glitch filter. The glitch filter has an input and an output. The glitch filter includes a rising time delay unit, a falling time delay unit, a NAND gate circuit, a NOR gate circuit, a first switch and a second switch. The rising time delay unit has an input and an output, wherein the input of the rising time delay unit is electrically coupled to the input of the glitch filter, and an output. The falling time delay unit has an input and an output, wherein the input of the falling time delay unit is electrically coupled to the input of the glitch filter. The NAND gate circuit has a first input, a second input and an output, wherein the first input of the NAND gate circuit is electrically coupled to the input of the glitch filter, a second input of the NAND gate circuit is electrically coupled to the output of the rising time delay unit. The NOR gate circuit has a first input, a second input and an output, wherein the first input of the NOR gate circuit is electrically coupled to the input of the glitch filter, the second input of the NOR gate circuit is electrically coupled to the output of the falling time delay unit. The first switch has a first terminal, a second terminal, and a control terminal, wherein the first terminal of the first switch is electrically coupled to a high voltage, a second terminal of the first switch is electrically coupled to the output of the glitch filter, and a control terminal of the first switch is electrically coupled to the output of the NAND gate circuit. The second switch has a first terminal, a second terminal, and a control terminal, wherein the first terminal of the second terminal is electrically coupled to the second terminal of the first switch, a second terminal of the second terminal is electrically coupled to the ground, and a control terminal of the second terminal is electrically coupled to the output of the NOR gate circuit.

Yet another aspect of the present invention is to provide a filtering method. The filtering method 500 includes the following steps. Generates a first delayed input signal by delaying the rising edge of an input signal to an electronic device for a first delay time. Generates a second delayed input signal by delaying the falling edge of the input signal for a second delay time. Generates a pull-up control signal in accordance with the input signal and the first delayed input signal. Generates a pull-down control signal in accordance with the input signal and the second delayed input signal. Generates a filtered input signal in accordance with the pull-up control signal and the pull-down control signal.

According to the one or more embodiments of the present invention, the step of generating a filtered input signal includes the following steps. Pulls up the voltage level of an output terminal of a control circuit to a high logic level in accordance with the pull-up control signal. Pulls down the voltage level of the output terminal of the control circuit to a low logic level in accordance with the pull-down control signal.

These and other features, aspects, and advantages of the present invention will become better understood with reference to the following description and appended claims.

It is to be understood that both the foregoing general description and the following detailed description are by examples, and are intended to provide further explanation of the invention as claimed.

BRIEF DESCRIPTION OF THE DRAWINGS

The invention can be more fully understood by reading the following detailed description of the embodiment, with reference made to the accompanying drawings as follows.

DETAILED DESCRIPTION

Reference will now be made in detail to the present embodiments of the invention, examples of which are illustrated in the accompanying drawings. Wherever possible, the same reference numbers are used in the drawings and the description to refer to the same or like parts.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the present invention.

As used herein, "around", "about" or "approximately" shall generally mean within 20 percent, preferably within 10 percent, and more preferably within 5 percent of a given value or range. Numerical quantities given herein are approximate, meaning that the term "around", "about" or "approximately" can be inferred if not expressly stated.

Figure 2A:
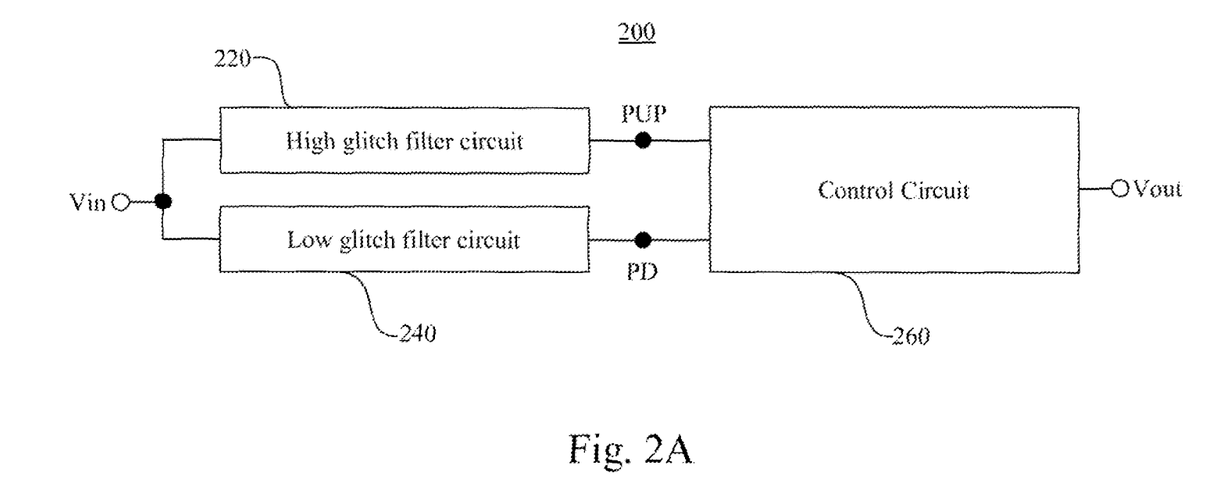
FIG. 2A is a block diagram of the glitch filter according to one embodiment of the present invention.

FIG. 2A is a block diagram of the glitch filter according to one embodiment of the present invention. As shown in FIG. 2A, the glitch filter 200 includes a high glitch filter circuit 220, a low glitch filter 240 and a control circuit 260. The high glitch filter circuit 220 is configured for generating a pull-up control signal PUP in accordance with the input signal Vin. The low glitch filter circuit 240 is configured for generating a pull-down control signal PD in accordance with the input signal. The control circuit is configured for determining the logic level of the output of the glitch filter 200 in accordance with the pull-up control signal PUP and the pull-down control signal PD.

The following paragraphs will discuss some embodiments about the glitch filter 200 in this invention. For purpose of specification, many details in practice will be described together with the following description. However, it should be understood that these details in practice are not used to limit the disclosure.

Figure 2B:
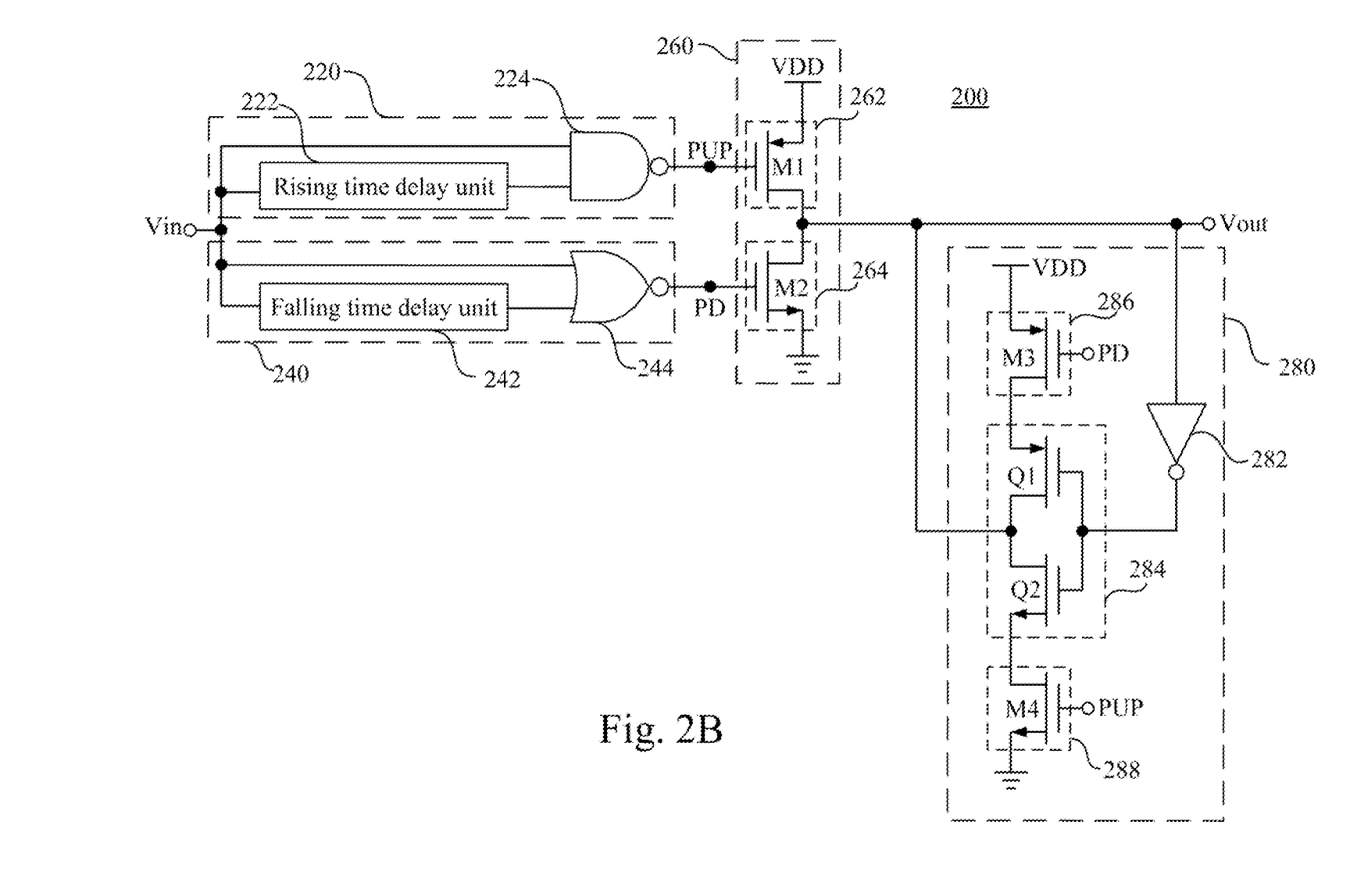
FIG. 2B is a circuit diagram of the glitch filter according to one embodiment of the present invention.

FIG. 2B is a circuit diagram of the glitch filter according to one embodiment of the present invention. As shown in FIG. 2B, the high glitch filter 220 includes a rising time delay unit 222 and a NAND gate circuit 224. The input of the rising time delay unit 222 is electrically coupled to the input of the glitch filter 200. The first input of the NAND gate circuit 224 is electrically coupled to the input of the glitch filter 200, and the second input of the NAND gate circuit 224 is electrically coupled to the output of the rising time delay unit 222.

The rising time delay unit 222 is configured for delaying the rising edge of the input signal Vin for a delay time tdr. The NAND gate circuit 224 is configured for generating the pull-up control signal PUP in accordance with the input signal Vin and the input signal Vin delayed by the rising time delay unit 222.

Figure 2C:
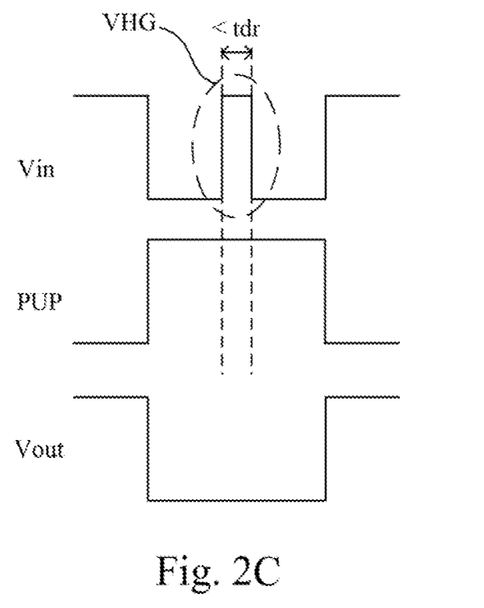
FIG. 2C is a wave diagram of the high glitch filter circuit 220 according to one embodiment of the present invention.

FIG. 2C is a wave diagram of the high glitch filter circuit 220 according to one embodiment of the present invention. For example, when there exists a high glitch VHG in the input signal Vin, the NAND gate circuit 224 outputs the pull-up control signal PUP with the high logic level (i.e., logic "1").

As shown in FIG. 2B, the low glitch filter circuit 240 includes a falling time delay unit 242 and a NOR gate circuit 244. The input of the falling time delay unit 242 is electrically coupled to the input of the glitch filter 200. The first input of the NOR gate circuit 244 is electrically coupled to the input of the glitch filter 200, and the second input of the NOR gate circuit 244 is electrically coupled to the output of the falling time delay unit 242.

The falling time delay unit 242 is configured for delaying the falling edge of the input signal Vin for a delay time tdf. The NOR gate circuit 244 is configured for generating the pull-down control signal PD in accordance with the input signal Vin and the input signal Vin delayed by the falling time delay unit 242. Additionally, the rising time delay unit 222 and the falling time delay unit 242 may be an inverter chain coupled to a resistor and a MOS capacitor in series with some extra devices for edge control. It is well-known for those of skills in the art that the delay time tdr and the delay time tdf can be set by controlling the value of the resistor and the capacitor.

Figure 2D:
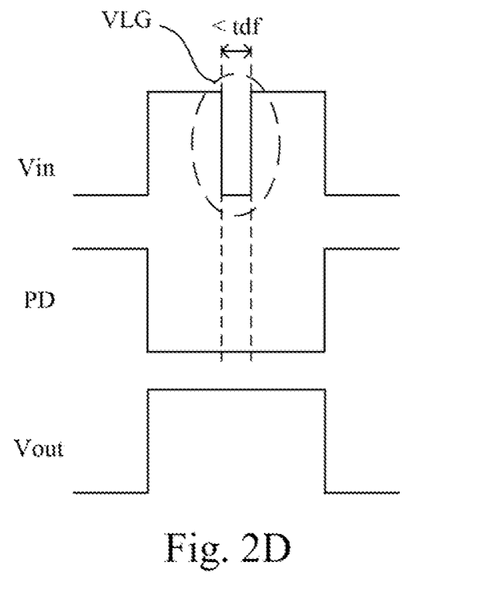
FIG. 2D is a wave diagram of the low glitch filter circuit 240 according to one embodiment of the present invention.

FIG. 2D is a wave diagram of the low glitch filter circuit 240 according to one embodiment of the present invention. For example, when there exists a low glitch VLG in the input signal Vin, the NOR gate circuit 244 generates the pull-down control signal PD with the low logic level (i.e., logic "0").

As shown in FIG. 2B, the control circuit 260 includes a pull-up unit 262 and a pull-down unit 264. The pull-up unit 262 is configured for pulling up the output of the glitch filter 200 to the high logic level (i.e., logic "1") in accordance with the pull-up control signal PUP. The pull-down unit is configured for pulling down the output of the glitch filter 200 to the low logic level (i.e., logic "0") in accordance with the pull-down control signal PD.

In this example, the pull-up unit 262 may be a switch M1, and the pull-down unit 264 may be a switch M2. The switch M1 and the switch M2 respectively have a first terminal, a second terminal and a control terminal. The first terminal of the switch M1 is electrically coupled to a high voltage VDD, the second terminal of the switch M1 is electrically coupled to the output of the glitch filter 200, and the control terminal of the switch M1 is electrically coupled to the output of the NAND gate circuit 224. The first terminal of the switch M2 is electrically coupled to the second terminal of the switch M1, the second terminal of the switch M2 is electrically coupled to the ground, and the control terminal of the switch M2 is electrically coupled to the output of the NOR gate circuit 244.

In operation, as shown in FIG. 2C, when there exists a high glitch VHG, wherein the width of the high glitch VHG is less than the tdr, the NAND gate circuit 224 generates the pull-up control signal PUP with the high logic level, and the NOR gate circuit 244 generates the pull-down control signal PD with the low logic level. Thus, the switch M1 and the switch M2 are turned off. The voltage level of output of glitch filter 200 is kept at the previous state for correctly generating filtered input signal Vout.

Similarly, as shown in FIG. 2D, when there exists a low glitch VLG, wherein the width of the low glitch VLG is less than the tdf, the NAND gate circuit 224 generates the pull-up control signal PUP with the high logic level, and the NOR gate circuit 244 generates the pull-down control signal PD with the low logic level. Thus, the switch M1 and the switch M2 are turned off. The voltage level of output of glitch filter 200 is kept at the previous state for correctly generating filtered input signal Vout.

In one embodiment of the present invention, the glitch filter 200 may further include a latch 280, as shown in FIG. 2B. The latch 280 is electrically coupled to the output of the glitch filter 200 in parallel, and the latch 280 is configured for keeping the previous logic level of the output of the glitch filter 200. Considered a case when the input signal Vin is an oscillating signal with a high frequency that exceeds the working range of the glitch filter 200. Then, the pull-up control signal PUP will stuck at logic "1", the pull-down control signal PD will stuck at logic "0", and both the switch M1 and switch M2 are disabled. Therefore, the latch 280 is used to keep the previous state of the filtered input signal Vout.

For example, the uncertainty of the input signal Vin as described above may happens during the power-up, we can connect the power-up signal, such as the high voltage VDD, to the latch 280 to ensure that the output of the glitch filter 200 is in a known state during the power-up. In this example, as shown in FIG. 2B, the latch 280 may include an inverter 282, an inverter 284, an enable unit 286, and an enable unit 288. The input of the inverter 282 is electrically coupled to the output of the glitch filter 200, the input of the inverter 284 is electrically coupled to the output of the inverter 282, and the output of the inverter 284 is electrically coupled to the output of the glitch filter 200. In this example, the enable unit 286 may be a switch M3, and the enable unit 288 may be a switch M4. And, the inverter 284 may includes switch Q1 and switch Q2. The switch M3, the switch M4, the switch Q1 and the switch Q2 respectively have a first terminal, a second terminal and a control terminal. The first terminal of the switch M3 is electrically coupled to the high voltage VDD, and the control terminal of the switch M3 is electrically coupled to the output of the NOR gate circuit 244. The first terminal of the switch Q1 is electrically coupled to the second terminal of the switch M1, the second terminal of the switch Q1 is electrically coupled to the output of the glitch filter 200, and the control terminal of the switch Q1 is electrically coupled to the output of the inverter 282. The first terminal of the switch Q2 is electrically coupled to the second terminal of the switch Q1, and the control terminal of the switch Q2 is electrically coupled to the output of the inverter 282. The first terminal of the switch M4 is electrically coupled to the second terminal of the switch Q2, the second terminal of the switch M4 is electrically coupled to the ground, and the control terminal of the switch M4 is electrically coupled to the output of the NAND gate circuit 224. In general, the switches discussed above may be implemented by the transistors, such as MOSFET, BJT, and so on.

In operation, the enable unit 286, such as the switch M3, is configured for turning on the pull-up path of the inverter 284 in accordance with the pull-down control signal PD. The enable unit 288, such as the switch M4, is configured for turning on the pull-down path of the inverter 284 in accordance with the pull-up control signal PUP. For example, in normal operation, when the pull-up control signal PUP is at the low logic level (i.e., logic "0") and the pull-down control signal PD is also at the low logic level, the switch. M3 is turned on and the switch M4 is turned off, which turns on the pull-up path of the inverter 284. Thus, when the input of the inverter 284 is at the low logic level, the output of the inverter 284 is pulled up to the high logic level through the switch M3, whereby keeping the state of the output of the glitch filter 200.

Figure 3:
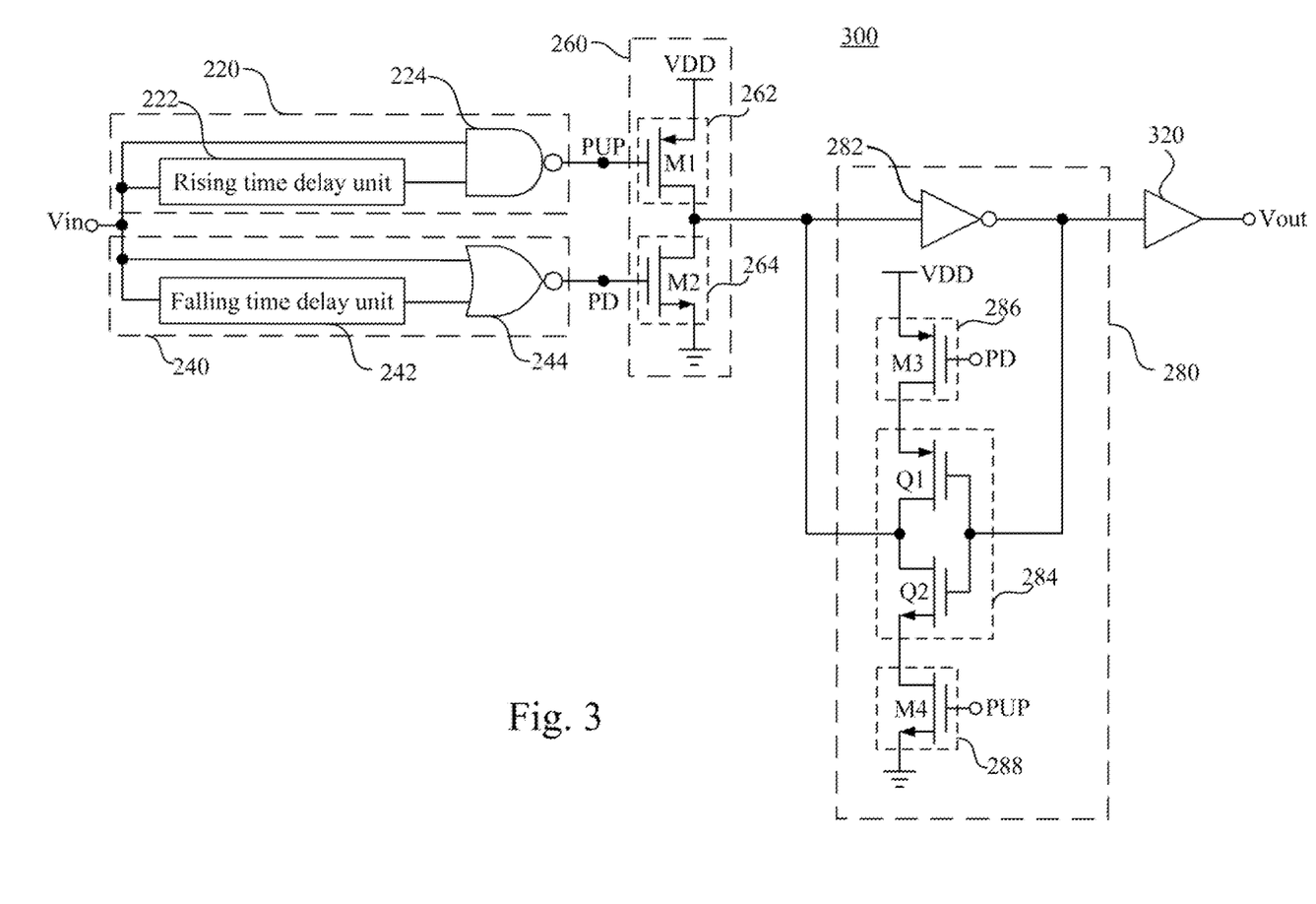
FIG. 3 is a circuit diagram of the glitch filter according to one embodiment of the present invention.

FIG. 3 is a circuit diagram of the glitch filter according to one embodiment of the present invention. Compared to the glitch filter 200, the glitch filter 300 shown in FIG. 3 further includes a buffer 320. The input of the buffer 320 is electrically coupled to the output of the inverter 282. The buffer 320 is configured for increasing the output driving ability of the glitch filter 300. The buffer 320 may be an inverter chain that can be adjusted in accordance with the practical application for those of skills in the art.

Figure 4:
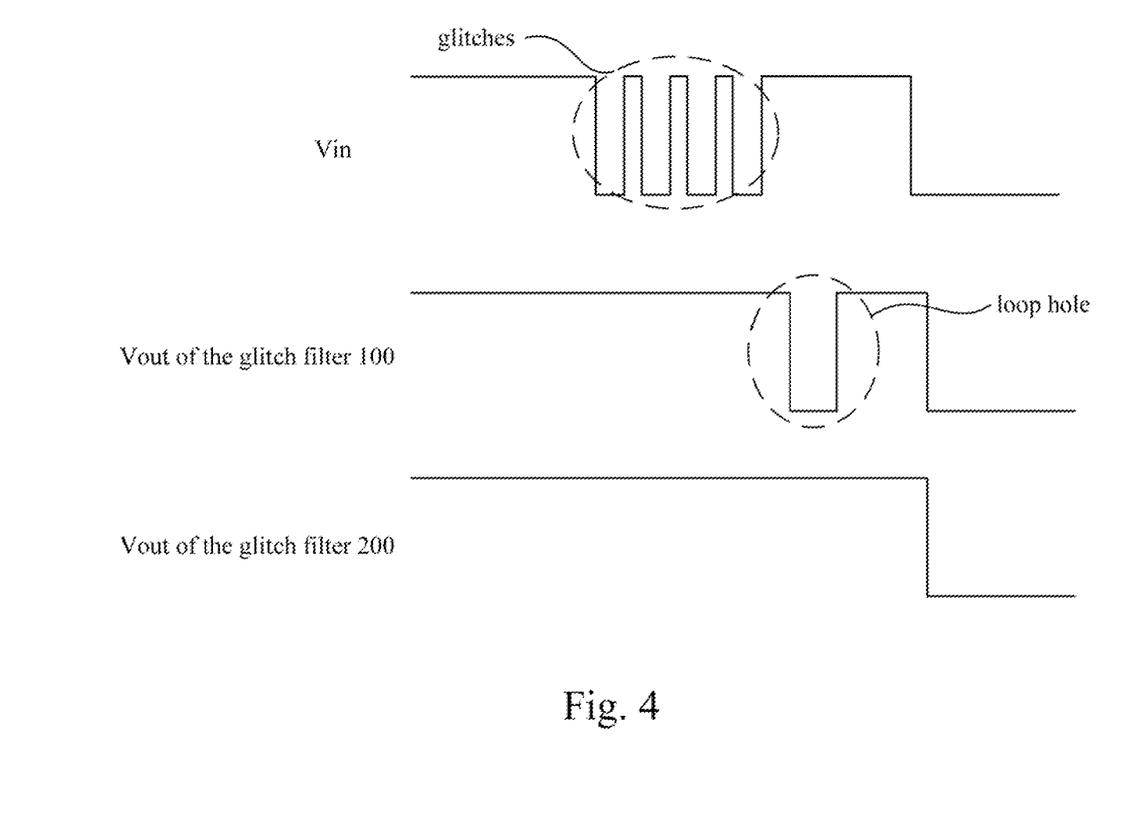
FIG. 4 is a wave diagram of the glitch filter 200 of the present invention and the glitch filter 100 of the prior art.

In summary, FIG. 4 is a wave diagram of the glitch filter 200 of the present invention and the glitch filter 100 of the prior art. Assume there are glitches with the width within the working range of both the glitch filter 100 and the glitch filter 200 in the input signal Vin, the filter glitch filter 200 of present invention can correctly generates the filtered input signal Vout. However, as mentioned before, the glitch filter 100 of the prior art may cause a loophole, which may fail the operation of the electronic circuits. Further, the overall edge delay caused by the glitch filter 200 of the present invention is "tdr+2g" for the rising edge or "tdf+2g" for the falling edge, where the "g" means the time of a gate delay. Compared with the glitch filter 100, the two gates delay reduction is achieved.

Figure 5:
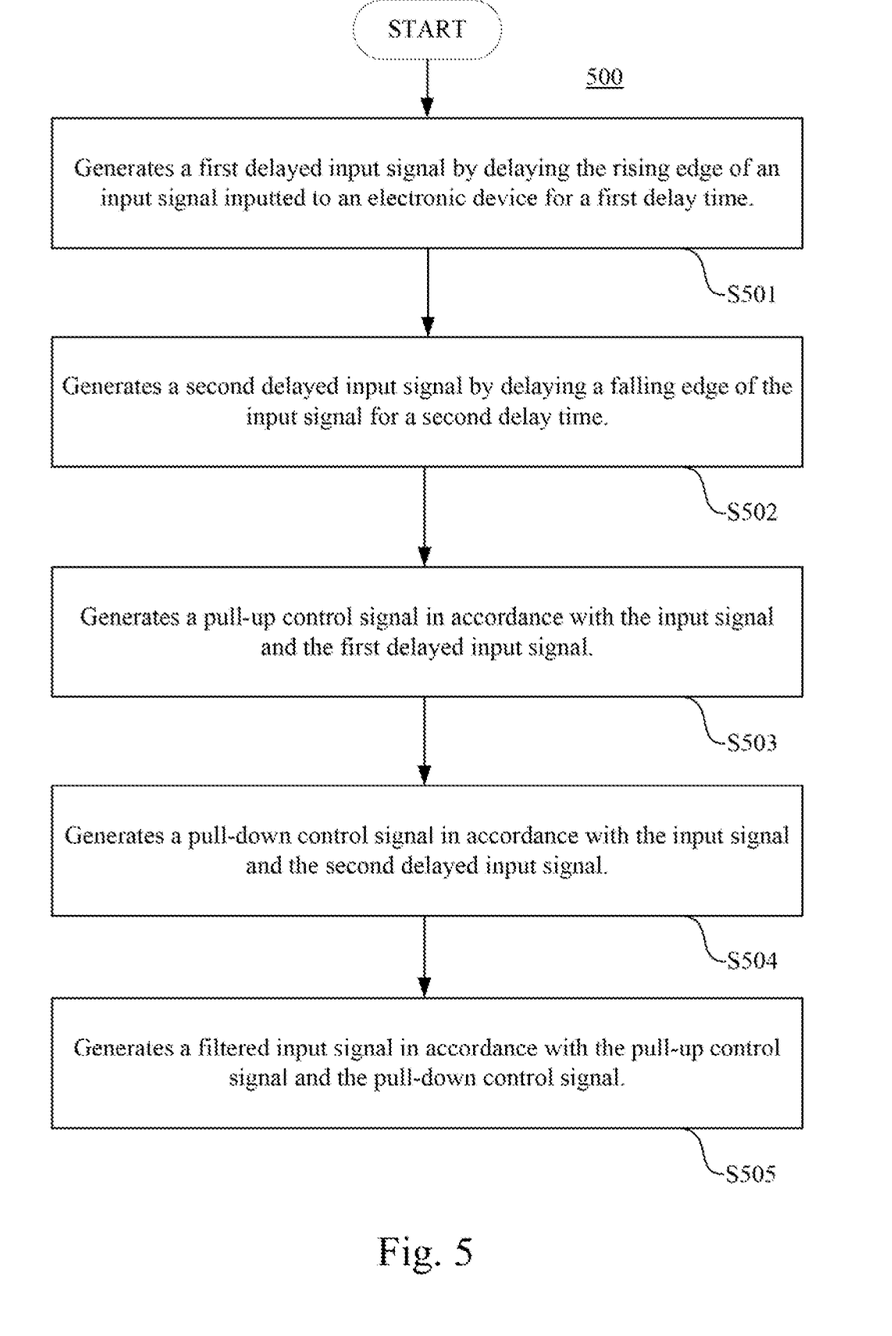
FIG. 5 is the flow chart of a filtering method according to one embodiment of the present invention.

In another aspect of present invention is to provide a filtering method for filtering the glitches. FIG. 5 is the flow chart of a filtering method according to one embodiment of the present invention. As shown in FIG. 5, the filtering method 500 includes the following steps. Generates a first delayed input signal by delaying the rising edge of an input signal to an electronic device for a first delay time. (Step S501) Generates a second delayed input signal by delaying the falling edge of the input signal for a second delay time. (Step S502) Generates a pull-up control signal in accordance with the input signal and the first delayed input signal. (Step S503) Generates a pull-down control signal in accordance with the input signal and the second delayed input signal. (Step S504) Generates a filtered input signal in accordance with the pull-up control signal and the pull-down control signal. (Step S505)

For example, as shown in FIG. 2B, the rising edge of the input signal Vin is delayed by the rising edge delay unit 222 for a delay time tdr, and the falling edge of the input signal Vin is delayed by the falling edge delay unit 242 for a delay time tdf. And the pull-up control signal PUP is generated by the NAND gate circuit 224, and the pull-down control signal PD is generated by the NOR gate circuit 244.

In one or more embodiments, the step S505 includes the following steps. Pulls up the voltage level of an output terminal of a control circuit to a high logic level (i.e., logic"1") in accordance with the pull-up control signal. Pulls down the voltage level of the output terminal of the control circuit to a low logic level in accordance with the pull-down control signal.

For example, as shown in FIG. 2B, the control circuit 280 may include a switch M1 and a switch M2. The switch M1 is configured for pulling up the voltage level of the output germinal Vout to the high logic level in accordance with the pull-up control signal PUP. The switch M2 is configured for pulling down the voltage level of the output terminal of the output terminal Vout to the low logic level in accordance with the pull-down control signal PD.

Although the present invention has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. A glitch filter, comprising:
a high glitch filter circuit configured for generating a pull-up control signal in accordance with an input signal;
a low glitch filter circuit configured for generating a pull-down control signal in accordance with the input signal;
a control circuit configured for determining a logic level of an output of the glitch filter in accordance with the pull-up control signal and the pull-down control signal; and
a latch electrically coupled to the output of the glitch filter in parallel, wherein the latch comprises:
a first inverter configured for inverting the output of the glitch filter;
a second inverter, wherein an input of the second inverter is electrically coupled to an output of the first inverter, and an output of the second inverter is electrically coupled to the output of the glitch filter;
a first enable unit configured for turning on a pull-up path of the second inverter in accordance with the pull-down control signal; and
a second enable unit configured for turning on a pull-down path of the second inverter in accordance with the pull-up control signal.

2. The glitch filter of claim 1, further comprising:
a buffer configured for increasing an output driving ability of the glitch filter, wherein an input of the buffer is electrically coupled to the output of the first inverter.

3. The glitch filter of claim 1, wherein the control circuit comprises:
a first switch configured for pulling up an output of the glitch filter to a high logic level in accordance with the pull-up control signal; and
a second switch configured for pulling down the output of the glitch filter to a low logic level in accordance with the pull-down control signal, wherein the first switch is coupled to the second switch at the output of the glitch filter.

4. The glitch filter of claim 1, wherein the high glitch filter circuit comprises:
a rising time delay unit configured for delaying the rising edge of the input signal for a first delay time; and
an NAND gate circuit configured for generating the pull-up control signal in accordance with the input signal and the input signal delayed by the rising time delay unit.

5. The glitch filter of claim 1, wherein the low glitch filter circuit comprises:
a falling time delay unit configured for delaying the falling edge of the input signal for a second delay time; and
a NOR gate circuit configured for generating the pull-down control signal in accordance with the input signal and the input signal delayed by the falling time delay unit.

6. A glitch filter having an input and an output, the glitch filter comprising:
a rising time delay unit having an input electrically coupled to the input of the glitch filter, and an output;
a falling time delay unit having an input electrically coupled to the input of the glitch filter, and an output;
a NAND gate circuit having a first input electrically coupled to the input of the glitch filter, a second input electrically coupled to the output of the rising time delay unit, and an output;
a NOR gate circuit having a first input electrically coupled to the input of the glitch filter, a second input electrically coupled to the output of the falling time delay unit, and an output;
a first switch having a first terminal electrically coupled to a high voltage, a second terminal directly coupled to the output of the glitch filter, and a control terminal electrically coupled to the output of the NAND gate circuit;
a second switch having a first terminal directly coupled to the second terminal of the first switch, a second terminal electrically coupled to the ground, and a control terminal electrically coupled to the output of the NOR gate circuit; and
an inverter having an input electrically coupled to the output of the glitch filter, and an output;

a third switch having a first terminal electrically coupled to the high voltage, a second terminal, and a control terminal electrically coupled to the output of the NOR gate circuit;

a fourth switch having a first terminal electrically coupled to the second terminal of the third switch, a second terminal electrically coupled to the output of the glitch filter, and the control terminal electrically coupled to the output of the inverter;

a fifth switch having a first terminal electrically coupled to the second terminal of the fourth switch, a second terminal, and a control terminal electrically coupled to the output of the inverter; and a sixth switch having a first terminal electrically coupled to the second terminal of the fifth switch, a second terminal electrically coupled to the ground, and a control terminal electrically coupled to the output of the NAND gate circuit.

7. The glitch filter of claim 6, further comprising:

a buffer for increasing the driving ability of the glitch filter, the buffer having an input electrically coupled to the output of the inverter.

8. A filtering method, comprising:

generating a first delayed input signal by delaying the rising edge of an input signal inputted to an electronic device for a first delay time;

generating a second delayed input signal by delaying a falling edge of the input signal for a second delay time;

generating a pull-up control signal in accordance with the input signal and the first delayed input signal;

generating a pull-down control signal in accordance with the input signal and the second delayed input signal;

generating a filtered input signal in accordance with the pull-up control signal and the pull-down control signal; and latching the filtered input signal by a latch, wherein the latch comprises:

a first inverter configured for inverting the filtered input signal;

a second inverter configured for inverting the output of the first inverter;

a first enable unit configured for turning on a pull-up path of the second inverter in accordance with the pull-down control signal; and a second enable unit configured for turning on a pull-down path of the second inverter in accordance with the pull-up control signal.

9. The filtering method of claim 8, wherein the step of generating the filtered input signal comprises:

pulling up a logic level of the filtered input signal to a high logic level, by a first switch, in accordance with the pull-up control signal, wherein a first terminal of the first switch is configured to output the filtered input signal; and pulling down the logic level of the filtered input signal to a low logic level, by a second switch, in accordance with the pull-down control signal, wherein a first terminal the second switch is coupled to first terminal of the first switch.

* * * * *